United States Patent
Honda et al.

(10) Patent No.: US 9,064,766 B2
(45) Date of Patent: Jun. 23, 2015

(54) SOLID-STATE IMAGING DEVICE

(71) Applicant: KABUSHIKI KAISHA TOSHIBA, Minato-ku (JP)

(72) Inventors: Hiroto Honda, Yokohama (JP); Kazuhiro Suzuki, Tokyo (JP); Mitsuyoshi Kobayashi, Yokohama (JP); Risako Ueno, Tokyo (JP); Honam Kwon, Kawasaki (JP); Hideyuki Funaki, Tokyo (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 39 days.

(21) Appl. No.: 14/077,537

(22) Filed: Nov. 12, 2013

(65) Prior Publication Data
US 2014/0131553 A1 May 15, 2014

(30) Foreign Application Priority Data
Nov. 13, 2012 (JP) .................. 2012-249321

(51) Int. Cl.
*H01L 27/00* (2006.01)
*H01L 27/146* (2006.01)

(52) U.S. Cl.
CPC .... *H01L 27/14627* (2013.01); *H01L 27/14625* (2013.01); *H01L 27/14605* (2013.01)

(58) Field of Classification Search
CPC .................. H01L 27/14625; H01L 27/14627; H04N 5/335
USPC ............. 250/208.1, 214.1, 216; 257/432, 436
See application file for complete search history.

(56) References Cited

U.S. PATENT DOCUMENTS

| | | | |
|---|---|---|---|
| 7,962,033 B2 | 6/2011 | Georgiev et al. | |
| 2009/0141361 A1* | 6/2009 | Yamagata et al. | 359/619 |
| 2013/0240709 A1 | 9/2013 | Ueno et al. | |
| 2013/0242161 A1 | 9/2013 | Kobayashi et al. | |
| 2014/0240559 A1* | 8/2014 | Ueno et al. | 348/294 |

FOREIGN PATENT DOCUMENTS

| | | |
|---|---|---|
| JP | 2011-171892 | 9/2011 |
| JP | 2012-47484 | 3/2012 |

OTHER PUBLICATIONS

Keith Fife, et al., "A 3D Multi-Aperture Image Sensor Architecture", IEEE 2006 Custom Intergrated Circuits Conference (CICC), Sep. 2006, 4 pages.

* cited by examiner

*Primary Examiner* — Kevin Pyo
(74) *Attorney, Agent, or Firm* — Oblon, McClelland, Maier & Neustadt, L.L.P.

(57) ABSTRACT

A solid-state imaging device according to an embodiment includes: an imaging element including an imaging area formed with a plurality of pixel blocks each including pixels; a first optical system forming an image of an object on an imaging surface; and a second optical system re-forming the image, which has been formed on the imaging surface, on the pixel blocks corresponding to microlenses, the second optical system including a microlens array formed with the microlenses provided in accordance with the pixel blocks. The microlenses are arranged in such a manner that an angle θ between a straight line connecting center points of adjacent microlenses and one of a row direction and a column direction in which the pixels are aligned is expressed as follows: $\theta > \sin^{-1}(2dp/D_{ml})$, where $D_{ml}$ represents microlens pitch, and dp represents pixel pitch.

6 Claims, 8 Drawing Sheets

SOLID-STATE IMAGING DEVICE

CROSS REFERENCE TO RELATED APPLICATIONS

This application is based upon and claims the benefit of priority from prior Japanese Patent Application No. 2012-249321 filed on Nov. 13, 2012 in Japan, the entire contents of which are incorporated herein by reference.

FIELD

Embodiments described herein relate generally to solid-state imaging devices.

BACKGROUND

In recent years, CMOS image sensors have been actively developed. Particularly, as miniaturization (according to a design rule for miniaturization) is progressing in semiconductor processes, single-panel color image sensors with more than 10 million pixels at pixel pitch of 1.4 µm, for example, are already available on the market. In the trend of the increasing numbers of pixels, attempts are being made to obtain physical information that has not been obtained due to the use of a large number of pixels, such as a distance to an object.

There has been a known imaging element that obtains information about the distance from the imaging element to an object by inserting a microlens array as a compound-eye optical system between the imaging lens and the imaging sensor. However, with this imaging element, the S/N ratio and the resolution of an image cannot be restored satisfactorily when the single image is re-formed by combining images formed by respective microlenses.

DETAILED DESCRIPTION

A solid-state imaging device according to an embodiment includes: an imaging element including an imaging area formed with a plurality of pixel blocks each including a plurality of pixels; a first optical system configured to form an image of an object on an imaging surface; and a second optical system configured to re-form the image, which has been formed on the imaging surface, on the plurality of pixel blocks corresponding to a plurality of microlenses, the second optical system including a microlens array formed with the plurality of microlenses provided in accordance with the plurality of pixel blocks. The plurality of microlenses are arranged in such a manner that an angle θ between a straight line connecting center points of adjacent microlenses and one of a row direction and a column direction in which the pixels are aligned is expressed as follows:

$$\theta > \sin^{-1}(2dp/D_{ml})$$

where $D_{ml}$ represents microlens pitch, and dp represents pixel pitch.

The following is a detailed description of embodiments, with reference to the accompanying drawings.

Figure 1:
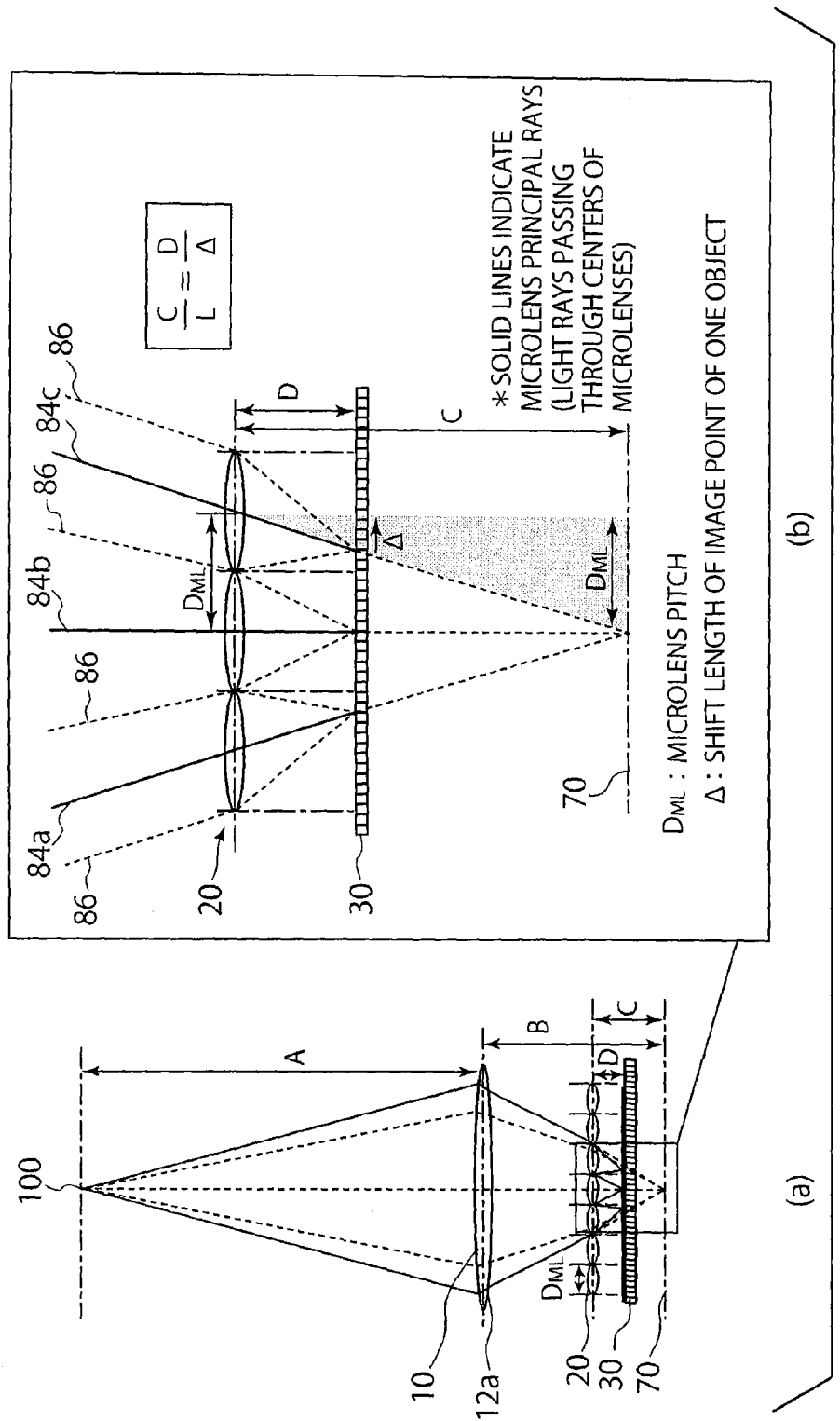
FIGS. 1(a) and 1(b) are diagrams showing a solid-state imaging device according to an embodiment.

FIG. 1(a) shows a solid-state imaging device according to an embodiment. The solid-state imaging device of this embodiment includes an imaging optical system (an imaging lens) 10, an optical system including a microlens array 20 having microlenses arranged in an array, and an imaging element 30. The imaging element 30 includes an imaging area having pixel blocks each including pixels. Each of the pixel blocks has pixels arranged in the X-axis direction and the Y-axis direction in an array. The imaging optical system 10 forms an image of an object 100 on a virtual imaging surface 70. The optical system including the microlens array 20 has microlenses provided in accordance with the above mentioned pixel blocks, and re-forms the image, which has been formed on the above described virtual imaging surface 70, on the pixel blocks corresponding to the respective microlenses.

FIG. 1(b) shows the shift lengths of image points of the same object in the optical system (a virtual image optical system) of the solid-state imaging device according to this embodiment.

When attention is paid only to the imaging optical system (the imaging lens 10), the principal ray and its family of rays from the object 100 form an image on the virtual imaging surface 70 determined by the focal length of the imaging optical system 10 and the distance from the object 100, so as to satisfy the relationship expressed by the equation (1).

$$\frac{1}{f} = \frac{1}{A} + \frac{1}{B} \tag{1}$$

Here, f represents the focal length of the imaging lens 10, A represents the distance from the object-side principal surface of the imaging lens 10 to the object 100, and B represents the distance from the image-side principal surface of the imaging lens 10 to the virtual imaging surface 70. The magnification (the lateral magnification) of the imaging lens 12 is expressed by the following equation (2).

$$M = \frac{B}{A} \tag{2}$$

In this embodiment, the virtual imaging surface 70 of the imaging lens 10 is located behind the imaging element 30 (or on the opposite side of the imaging lens 10 from the object 100). At this point, the microlens array (hereinafter also referred to as ML) 20 is located in front of the virtual imaging surface 70, and therefore, light is collected on the surface of the imaging element 30 that has pixels arranged in front of the virtual imaging surface 70 in practice. As a result, the light rays form a reduced image compared with the virtual image. The microlens imaging system forming the microlens array 20 is expressed by the following equation (3).

$$\frac{1}{g} = -\frac{1}{C} + \frac{1}{D} \quad (3)$$

Here, g represents the focal length of the microlenses, C represents the distance from the object-side principal surface of the microlenses to the virtual imaging surface 70, and D represents the distance from the image-side principal surface of the microlenses to the surface of the imaging element 30. At this point, the magnification of the microlens imaging system is expressed by the following equation (4).

$$N = \frac{D}{C} \quad (4)$$

Here, the variable E shown in the equation (5) in terms of a geometric relationship is introduced. When the optical system is a fixed focus optical system, the variable E is a fixed set value.

$$E = B - C \quad (5)$$

Here, $D_{ML}$ represents the alignment pitch of microlenses 14 or the distance between the microlenses in a case where two adjacent microlenses are selected. At this point, light rays 84a, 84b, 84c, and 86 emitted from the same object form images at the adjacent microlenses 14 independently of one another. The distance $D_{ML}$ and the image shift length Δ on one side are expressed by the equation (6) in terms of the geometric relationship among the principal rays 84a, 84b, and 84c at the respective microlenses shown in FIG. 1(b).

$$\frac{C}{D_{ML}} = \frac{D}{\Delta} \quad (6)$$

With the above parameters, the changes in the respective parameters with respect to movements (changes in A) of the object 100 are expressed. Where $A_0$ represents the distance from the imaging lens 10 to the object that can be imaged, each parameter having a subscript 0 to the right thereof ($B_0$, $C_0$, $D_0$, and $\Delta_0$) represents a value that is achieved when the distance to the object is $A_0$. When $A_0$ is determined, each of the above mentioned parameters is uniquely determined in a fixed focus optical system.

Here, M (imaging lens magnification) represents the change in the parameter D that is observed when the distance from the imaging lens 10 to the object 100 changes from $A_0$ to A. According to the equations (1) through (5), the imaging lens magnification M has the relationship expressed in the equation (7).

$$D = \left(\frac{1}{g} + \frac{1}{C}\right)^{-1} = \left(\frac{1}{g} + \frac{1}{(B-E)}\right)^{-1} = \quad (7)$$

-continued $$\left(\frac{1}{g} + \frac{1}{B - (b_0 - C_0)}\right)^{-1} = \left(\frac{1}{g} - \frac{1}{-\frac{D_0}{N_0} + (M_0 - M)f}\right)^{-1}$$

Also, according to the equations (1), (2), (6), and (7), the distance A from the imaging lens 10 to the object 100, the shift length Δ, and the magnification M have the relationship expressed in the following equation (8).

$$A = \left(\frac{1}{f} - \frac{1}{B}\right)^{-1} = \quad (8)$$

$$\left(\frac{1}{f} - \frac{1}{B_0 - C_0 + C}\right)^{-1} = \left(\frac{1}{f} - \frac{1}{(M_0 + 1)f - \frac{D_0}{N_0} + \frac{D_{ML}D}{\Delta}}\right)^{-1}$$

That is, the distance between the object 100 and the imaging lens 10 can be determined from the image shift length Δ.

In a case where the microlens array 20 is not provided, and the imaging element 30 is located on the virtual imaging surface 70, an image of the object is formed on the virtual imaging surface 70. In a case where light rays emitted from the same object are divided by microlenses, and images are formed on the surface of the imaging element 30 located in front of the virtual imaging surface 70 as in this embodiment, the same object is imaged more than once in accordance with parallaxes. Accordingly, images formed by the microlenses imaging the same object more than once (microlens images) are output as an image.

The microlens images are images formed when the microlenses are arranged at regular pitch. The microlens images are reduced from the image, which should have been formed on the virtual imaging surface 70, by the magnification N (according to the equation (4)) of the microlens imaging system. The obtained microlens images are re-formed as a two-dimensional image without an overlapping portion, by subjecting the read image data of each microlens to a re-forming operation. The re-forming operation will be described later.

Having parallaxes smaller than the aperture of the imaging lens 10, the obtained microlens images can be subjected to a three-dimensional processing operation that uses parallaxes.

Figure 2:
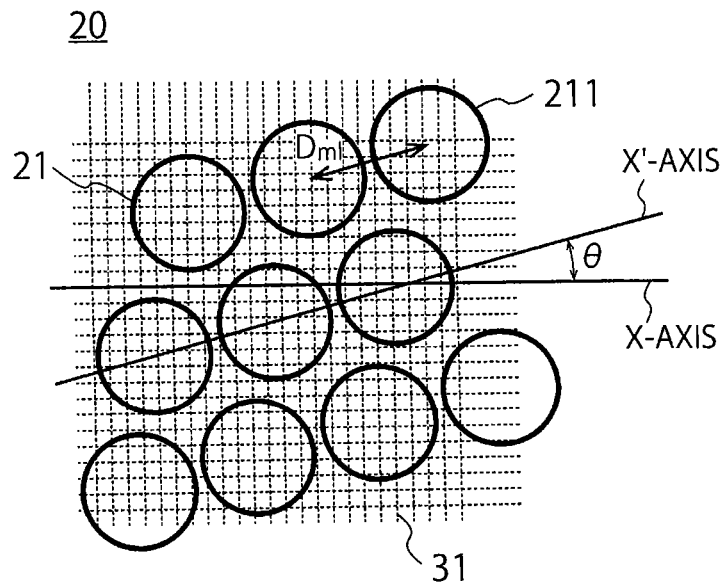
FIG. 2 is a diagram showing a microlens array that is a hexagonal closest packed array used in the solid-state imaging device of the embodiment.
Figure 3:
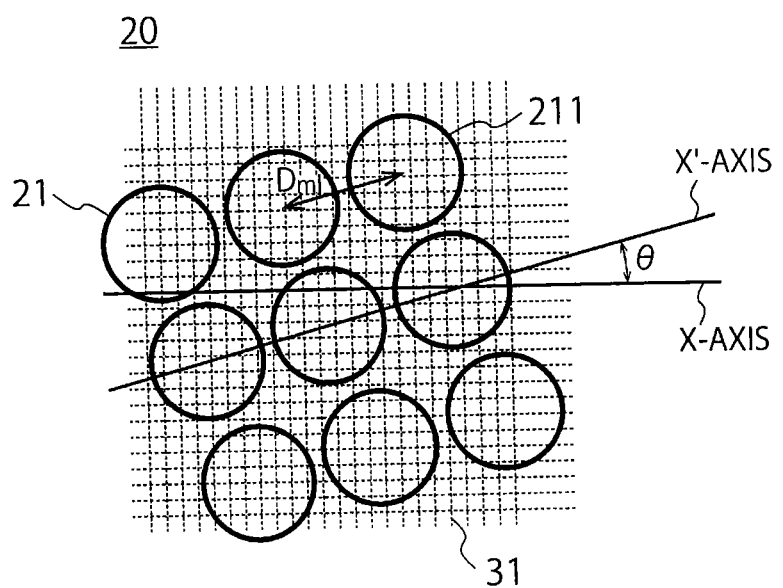
FIG. 3 is a diagram showing a microlens array that is a square array used in the solid-state imaging device of the embodiment.

FIGS. 2 and 3 show plane arrangement methods that can be used for the microlens array 20 in this embodiment. FIG. 2 is a diagram showing an example case where the microlenses 21 of the microlens array 20 are arranged in a hexagonal closest packed array, and FIG. 3 is a diagram showing an example case where the microlenses 21 of the microlens array 20 are squarely arranged. The distance between the centers 211 of the microlenses 21 is represented by $D_{ml}$.

Here, the microlens array 20 is placed on the image entering side of the imaging element 30. When the components are stacked on a plane surface, an angle θ is the angle between the X-axis representing one direction in which the pixels 31 are aligned, and the X'-axis of the microlens array 20 defined by a straight line connecting the centers 211 of microlenses 21.

Figure 4:
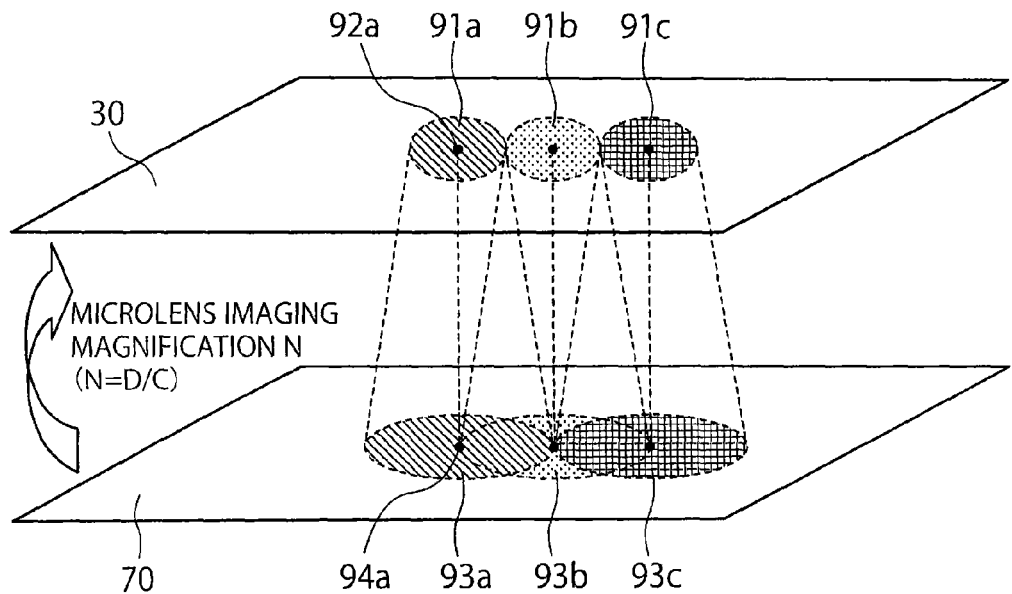
FIG. 4 is a diagram for explaining image overlaps that appear when the imaging magnification N is 0.5.

Referring now to FIG. 4, a method of re-forming a two-dimensional image without any overlapping portion from microlens images formed by repeatedly imaging the same object is described.

FIG. 4 shows an example case where first through third microlenses are adjacent to one another, and form microlens images 91a, 91b, and 91c, respectively, on the surface of the imaging element 30. The visual fields in which the microlens images 91a, 91b, and 91c are formed are visual fields 93a,

93b, and 93c that overlap with one another on the virtual imaging surface 70. FIG. 4 illustrates a case where the reduction rate N is 0.5. As a result of enlarging each visual field by 0.5, each object point is imaged two or more times. When the reduction ratio N is 0.5, the image on the virtual imaging surface 70 can be reproduced by enlarging each microlens image by 1/N (=2, when N=0.5). In FIG. 4, reference numeral 92a indicates the image center of the first microlens, and reference numeral 94a indicates the center of the visual field of the first microlens on the virtual imaging surface 70.

In this embodiment, overlapping portions of the visual fields are processed by subjecting the luminance values output from the pixels to an averaging operation. In this manner, one image can be re-formed from data that has overlapping portions.

Figure 5:
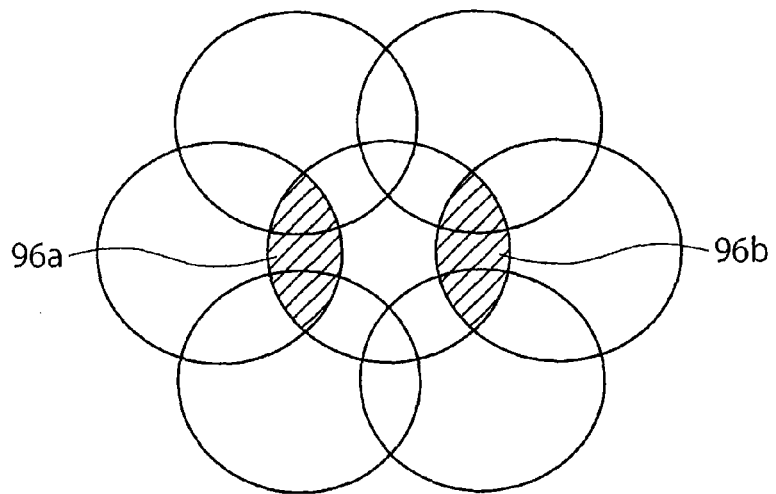
FIG. 5 is a diagram for explaining image overlaps and added portions.

FIG. 5 shows overlaps in the image data of the respective microlenses at the time of image re-formation. The seven circles represent the image areas subjected to an enlarging operation that is performed mainly on the center of each microlens image. For example, shaded portions 96a and 96b are the overlapping portions of the microlens image data in this case. At the overlapping portions, the corresponding two or three sets of image data is subjected to averaging, to form a single image. In the process of averaging, the random noise in each microlens image is effectively reduced.

Normally, when random noises having no correlation with one another are subjected to averaging N times, the standard deviation of noise becomes $1/N^{1/2}$. Therefore, as the number N of overlaps becomes larger, the reduction in image noise becomes larger.

However, when random noises having a correlation with one another are subjected to averaging, noises are not reduced. For example, if there are horizontal linear noises in FIG. 5, the added microlens images have common horizontal linear noises at the added portions 96a and 96b that are the shaded portions in the drawing. Therefore, a noise reduction effect cannot be expected.

In an image element, pixels are normally selected in order of row number, and columns are normally read in parallel. Therefore, horizontal linear noises or vertical linear noises are liable to appear.

Figure 6:
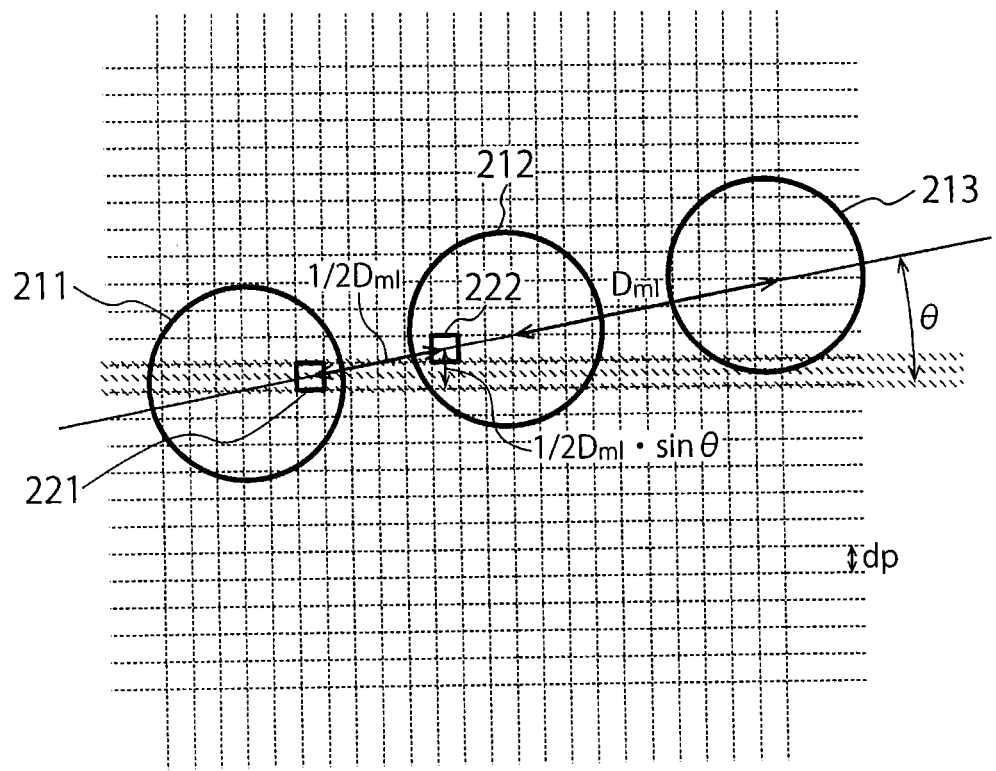
FIG. 6 is a diagram for explaining the condition for two overlapping pixels to exist in the same row.

In a case where the added microlens images have common horizontal or vertical linear noises, a straight line connecting the centers of microlenses coincides with the X-axis direction or the Y-axis direction formed by the pixel array of the imaging element 30. Referring now to FIG. 6, the condition for the axis directions to match is described.

FIG. 6 shows three microlenses 211, 212, and 213. The grids represent the pixel array. Here, the straight line connecting the centers of the microlenses forms an angle θ with the horizontal axis of the pixels. The center-to-center distance between the microlenses (the microlens pitch) is represented by $D_{ml}$, and the pixel pitch is represented by dp. If the pixel pitch in the X-direction and the pixel pitch in the Y-direction differ from each other, the pitch in the Y-direction is represented by dp. For example, pixels 221 and 222 exist in the microlenses 211 and 212, and are located on the straight line connecting the centers of the microlenses 211 and 212. If the distance between the pixels 221 and 222 is $\frac{1}{2} \times D_{ml}$, the microlens images at these pixels overlap with each other and are added when each of the microlens images is enlarged by 2 (=1/N). The condition for the pixel 221 and the pixel 222 to be located in different rows from each other at this point is expressed as follows.

$$\tfrac{1}{2} \times D_{ml} \times \sin\theta > dp \qquad (9)$$

If $D_{ml}/dp$ is 20, for example, sin θ should be greater than 0.1. Accordingly, when the angle θ is not smaller than $-\sin^{-1}(0.1)$ and not larger than $\sin^{-1}(0.1)$, the pixels might not overlap with each other. The reason that the distance between the pixels is assumed to be $\frac{1}{2} \times D_{ml}$ is that pixels located at a distance of $\frac{1}{2} \times D_{ml}$ or longer from each other often overlap with each other.

Figure 7:
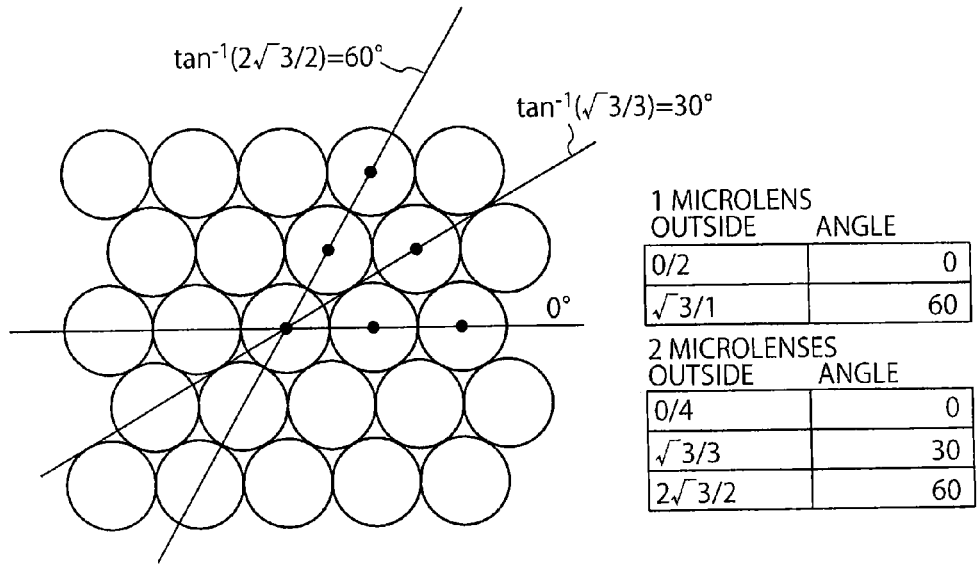
FIG. 7 is a diagram for explaining angles θ that should be avoided in a hexagonal closest packed array.
Figure 8:
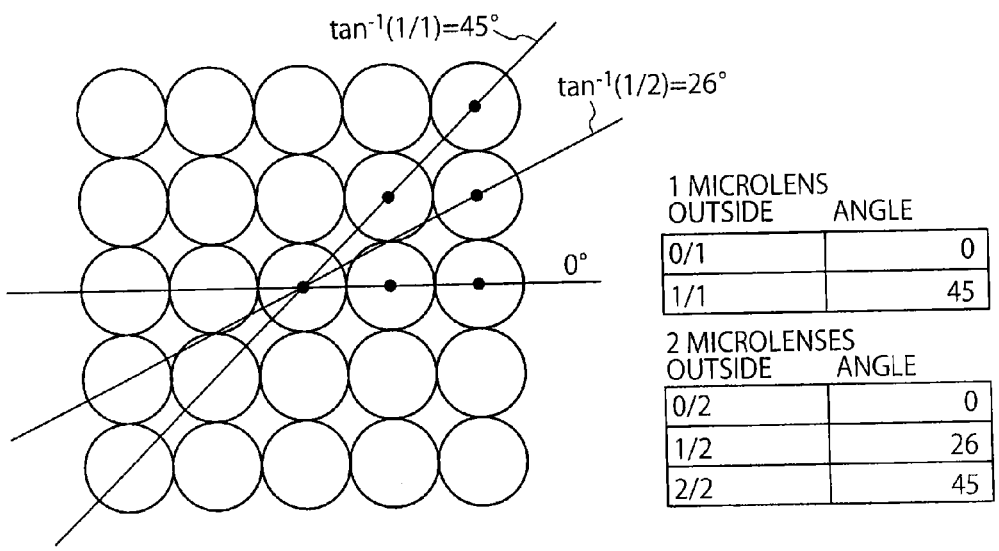
FIG. 8 is a diagram for explaining angles θ that should be avoided in a square array.

Referring now to FIGS. 7 and 8, angles θ that should be avoided are described. FIG. 7 shows a microlens array that is a hexagonal closest packed array. First, straight lines connecting the centers of microlenses are described. Where the direction in which microlenses are aligned at the highest density is the direction at 0°, the above described noise reduction effect cannot be expected when the axis in the horizontal direction of the pixel array coincides with the direction at 0°. The same applies in cases where the angle θ is 30° and 60°, as shown in FIG. 7. For example, in cases where the 0° axis of the microlens array forms an angle of 15° with the horizontal axis of the pixels, pixels in different rows overlap with each other and are added. Therefore, such cases are preferable.

As can be seen from FIG. 8, in a square array, the above mentioned noise reduction effect cannot be expected when the angle θ is 0°, 26°, or 45°.

Figure 9:
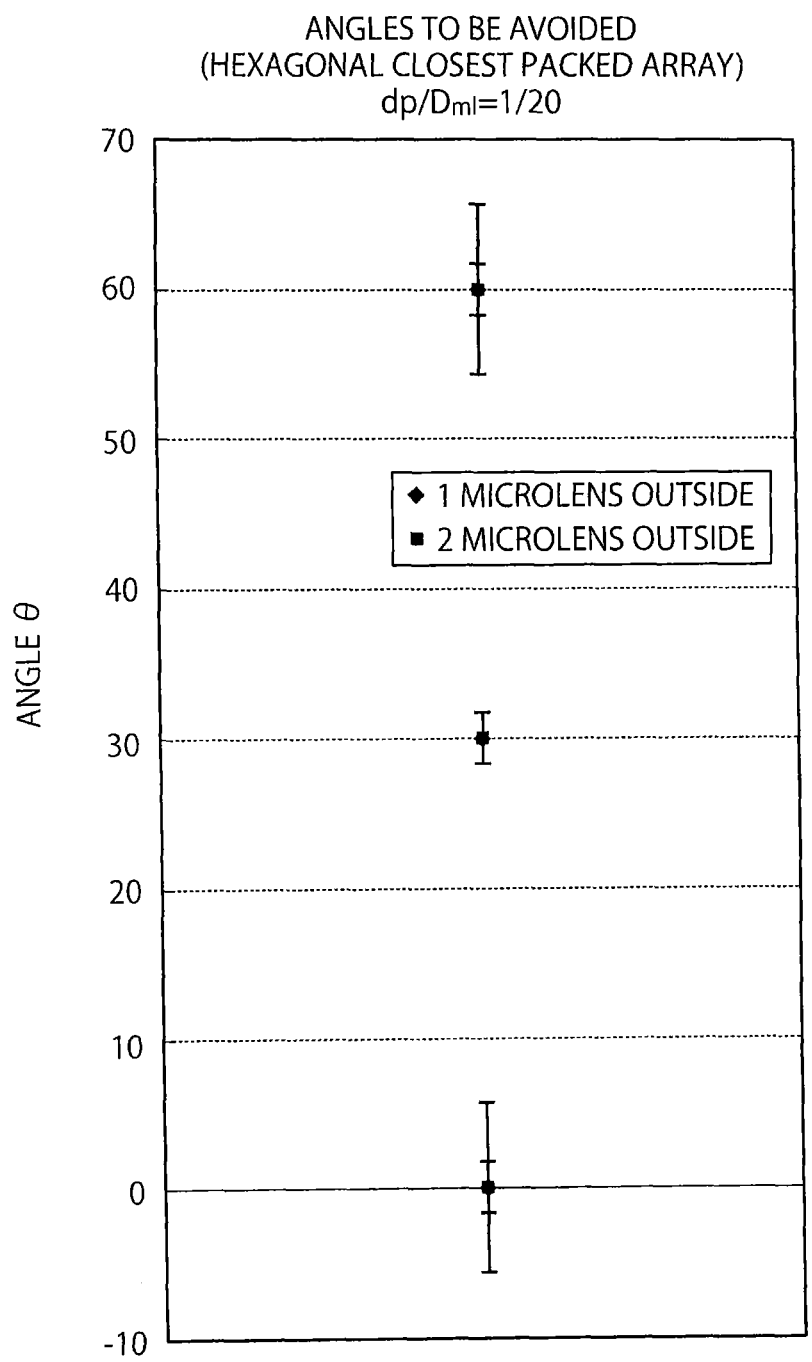
FIG. 9 is a diagram showing example angles θ that should be avoided in a hexagonal closest packed array.

FIG. 9 shows the angles θ that should be avoided in a hexagonal closest packed array. In FIG. 9, angles are determined, with $dp/D_{ml}$ being equal to 1/20. The error bars indicate the conditions for two pixels located at a distance of $\frac{1}{2} \times D_{ml}$ from each other to exist in the same row. When the target microlens is to overlap with a microlens that is located one microlens outside, the error bars indicate the ranges of angles θ expressed as follows according to the equation (9).

$$\tfrac{1}{2} \times D_{ml} \times \sin\theta \leq dp$$

That is, in the case of a hexagonal closest packed array, the angles θ to be avoided are expressed as follows.

$$-\sin^{-1}(2dp/D_{ml}) \leq \theta \leq \sin^{-1}(2dp/D_{ml})$$

$$30° - \sin^{-1}(2dp/D_{ml}) \leq \theta \leq 30° + \sin^{-1}(2dp/D_{ml})$$

$$60° - \sin^{-1}(2dp/D_{ml}) \leq \theta \leq 60° + \sin^{-1}(2dp/D_{ml})$$

Figure 10:
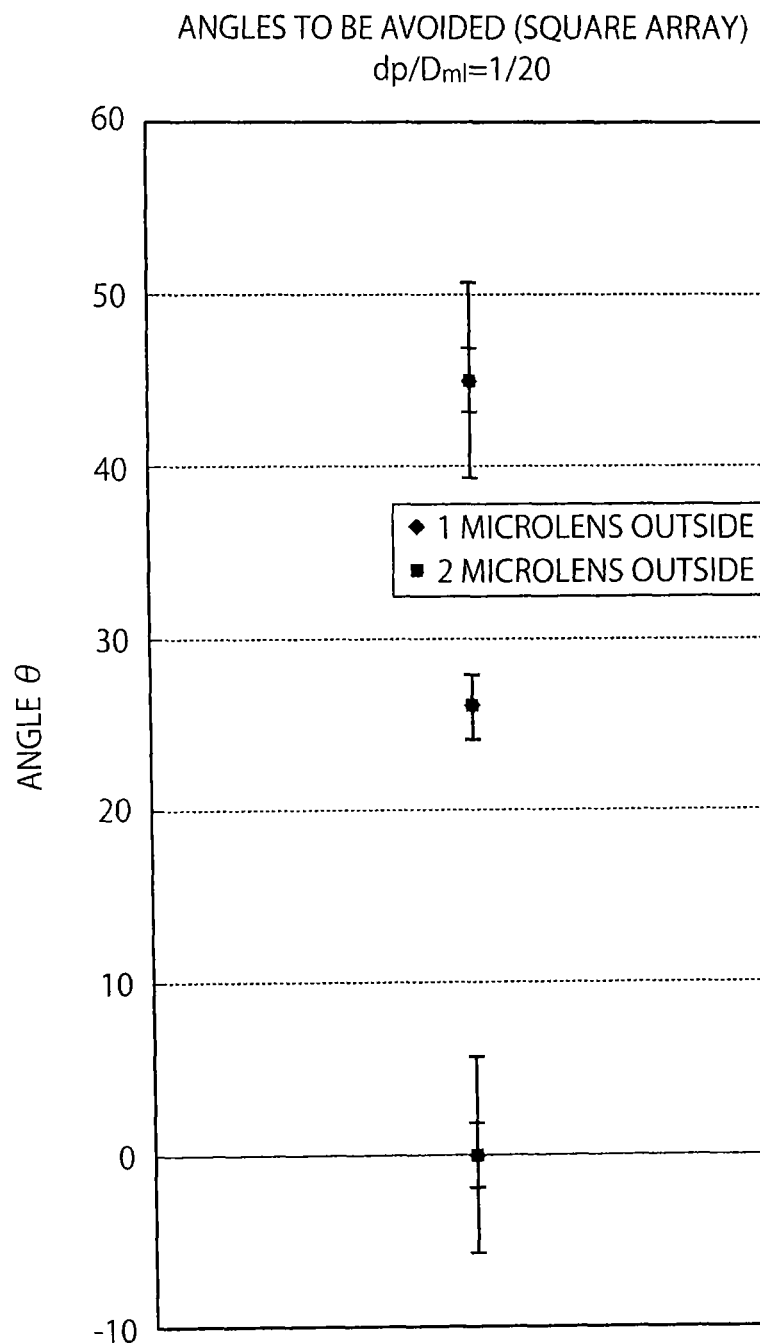
FIG. 10 is a diagram showing example angles θ that should be avoided in a square array.

FIG. 10 shows the angles θ to be avoided in a case where the microlenses are squarely arranged. In FIG. 10, angles are determined, with $dp/D_{ml}$ being equal to 20. In the case of a square array, the angles θ to be avoided are expressed as follows.

$$-\sin^{-1}(2dp/D_{ml}) \leq \theta \leq \sin^{-1}(2dp/D_{ml})$$

$$26° - \sin^{-1}(2dp/D_{ml}) \leq \theta \leq 26° + \sin^{-1}(2dp/D_{ml})$$

$$45° - \sin^{-1}(2dp/D_{ml}) \leq \theta \leq 45° + \sin^{-1}(2dp/D_{ml})$$

As described above, the microlenses are arranged so that the axis formed by a straight line connecting the centers of microlenses forms a constant angle with the horizontal axis of pixels. In this manner, a low noise solid-state imaging device can be realized.

As described so far, this embodiment can provide a solid-state imaging device that can restore the S/N ratio and the resolution of an image even when the image is re-formed.

This embodiment can also provide a solid-state imaging device that can obtain distance information and improve SNR, without false color generation at the time of imaging of an object at high spatial frequency.

Figure 11:
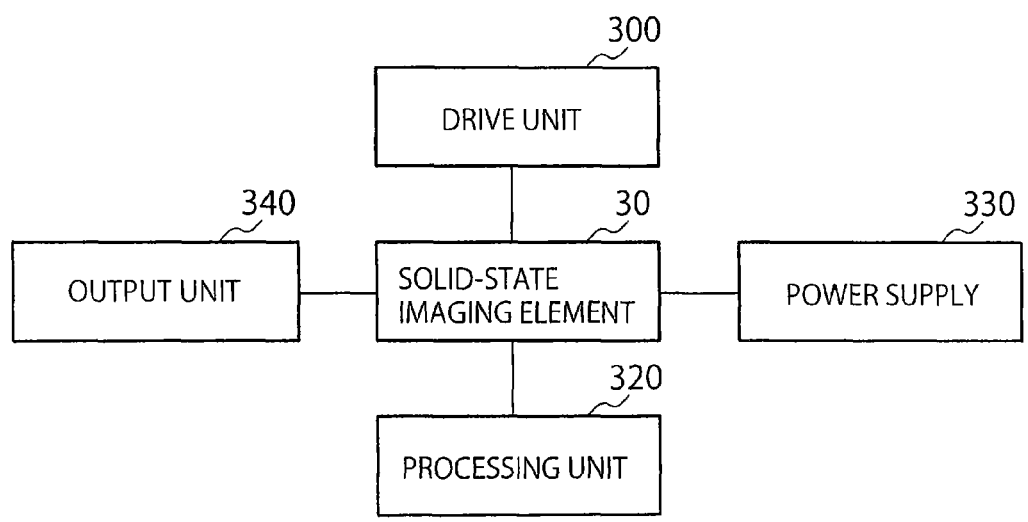
FIG. 11 is a block diagram showing a solid-state imaging device according to another embodiment.

As shown in FIG. 11, any of the above described solid-state imaging devices may include a drive unit 300 that drives the imaging element 30, and a processing unit 320 that processes signals output from the imaging element 30. Any of the above described solid-state imaging devices may also include a power supply 330 that is necessary for driving the imaging element 30. Any of the above described solid-state imaging devices may also include an output unit 340 such as a display. An output device (not shown) that is provided outside may be connected to the solid-state imaging device. Each signal output from the imaging element 30 is displayed by the output unit 340 or the output device.

Any of the above described solid-state imaging devices may be a mobile communication terminal, a digital camera, a personal computer, or a surveillance camera, for example.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A solid-state imaging device comprising:
   an imaging element including an imaging area formed with a plurality of pixel blocks each including a plurality of pixels;
   a first optical system configured to form an image of an object on an imaging surface; and
   a second optical system configured to re-form the image, which has been formed on the imaging surface, on the plurality of pixel blocks corresponding to a plurality of microlenses, the second optical system including a microlens array formed with the plurality of microlenses provided in accordance with the plurality of pixel blocks,
   wherein the plurality of microlenses are arranged in such a manner that an angle $\theta$ between a straight line connecting center points of adjacent microlenses and one of a row direction and a column direction in which the pixels are aligned is expressed as follows:

$$\theta > \sin^{-1}(2dp/D_{ml})$$

where $D_{ml}$ represents microlens pitch, and dp represents pixel pitch.

2. The device according to claim 1, wherein
the plurality of microlenses are arranged in a hexagonal closest packed array, and
the angle $\theta$ is not included in the following ranges:

$$30°-\sin^{-1}(2dp/D_{ml}) \leq \theta \leq 30°+\sin^{-1}(2dp/D_{ml})$$

$$60°-\sin^{-1}(2dp/D_{ml}) \leq \theta \leq 60°+\sin^{-1}(2dp/D_{ml}).$$

3. The device according to claim 1, wherein
the plurality of microlenses are arranged in a square array, and
the angle $\theta$ is not included in the following ranges:

$$26°-\sin^{-1}(2dp/D_{ml}) \leq \theta \leq 26°+\sin^{-1}(2dp/D_{ml})$$

$$45°-\sin^{-1}(2dp/D_{ml}) \leq \theta \leq 45°+\sin^{-1}(2dp/D_{ml}).$$

4. The device according to claim 1, further comprising a processing unit configured to process a signal output from the imaging element.

5. The device according to claim 1, further comprising a drive unit configured to drive the imaging element.

6. The device according to claim 1, further comprising a power supply connected to the imaging element.

* * * * *